United States Patent [19]
Lee et al.

[11] Patent Number: 5,521,861
[45] Date of Patent: May 28, 1996

[54] HIGH-SPEED HIGH-DENSITY SRAM CELL

[75] Inventors: Kuo-Hua Lee, Orlando, Fla.;
Chun-Ting Liu, Berkeley Heights, N.J.

[73] Assignee: AT&T Corp., Murray Hill, N.J.

[21] Appl. No.: 326,575

[22] Filed: Oct. 20, 1994

[51] Int. Cl.$^6$ .................................................... G11C 11/00
[52] U.S. Cl. ........................... 365/156; 365/154; 257/903
[58] Field of Search .................................. 365/156, 154, 365/190, 161; 257/903; 327/215

[56] References Cited

U.S. PATENT DOCUMENTS

| | | | |
|---|---|---|---|
| 4,623,989 | 11/1986 | Blake | 365/156 |
| 5,327,377 | 7/1994 | Kawashima | 365/156 |
| 5,404,326 | 4/1995 | Okamoto | 365/154 X |

FOREIGN PATENT DOCUMENTS 0151897  8/1985  Japan ..................................... 365/156

OTHER PUBLICATIONS

H. J. M. Veendrick, MOS ICs, 1992, pp. 310–311, VCH Publishers Inc., New York.
C. T. Liu et al, High Reliability & High Performance . . . Using Self–Aligned LDD Structures, 1992, pp. 823–826, IEDM 92.

*Primary Examiner*—David C. Nelms
*Assistant Examiner*—Huan Hoang

[57] ABSTRACT

A six-transistor SRAM of a high-density memory comprises two thin-film n-channel pull-down transistors and four conventional p-channel load and access transistors. As embodied in a semiconductor chip, the cell is simpler than priorly known six-transistor cells and is relatively immune from the deleterious effects of sodium ions and hot-carrier aging.

10 Claims, 1 Drawing Sheet

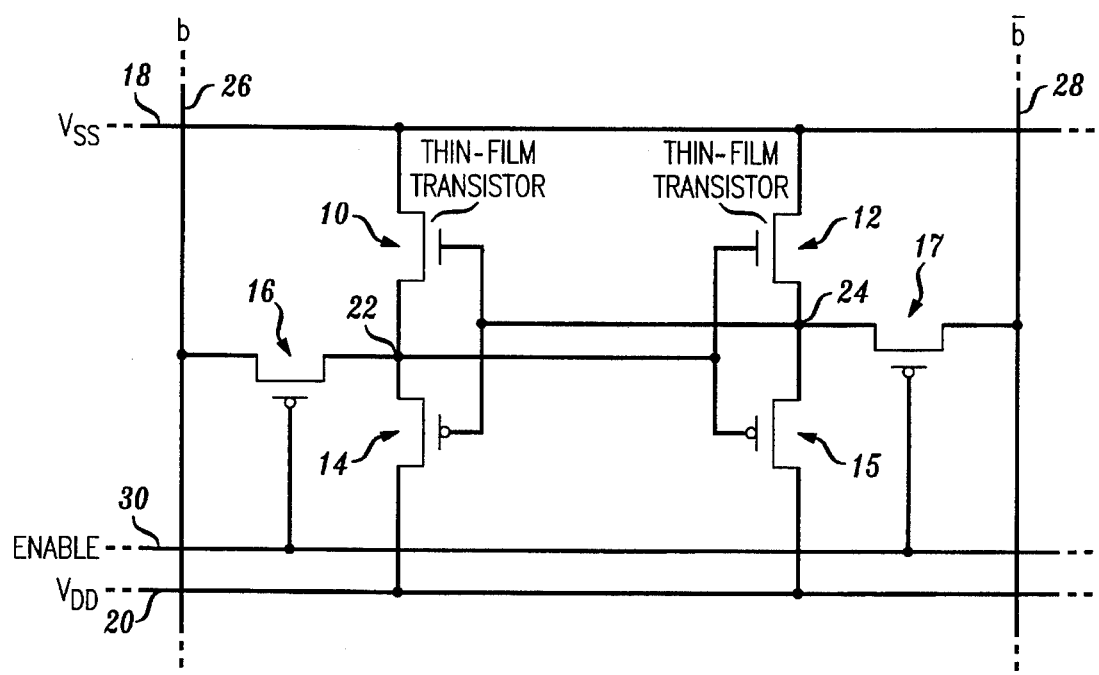

HIGH-SPEED HIGH-DENSITY SRAM CELL

BACKGROUND OF THE INVENTION

This invention relates to memory circuits and, more particularly, to the circuit arrangement of a basic cell of a static random-access-memory (SRAM) configuration.

The basic cell of one widely used conventional SRAM consists of six transistors including four standard n-channel metal-oxide-semiconductor (MOS) transistors formed in a crystalline silicon substrate. Two of these n-channel units in each cell function as access transistors, while the other two n-channel units operate as so-called pull-down transistors, as is well known in the art. (See, for example, the cell described on pages 310–311 of *MOS ICs* by H. J. M. Veendrick, VCH Publishers Inc., New York, 1992.)

The aforedescribed standard six-transistor SRAM cell further includes two load devices each comprising a p-channel transistor. In high-density versions of such a cell, the p-channel devices typically comprise thin-film transistors (TFTs) formed in polysilicon on top of the aforementioned n-channel transistors. Cells including p-channel TFTs are well known in the art. Each such TFT is connected to an associated pull-down transistor of the opposite conductivity type to form an inverter. In turn, the inverters are cross-connected in a standard way to form a flip-flop. During a write operation, the condition of the state stored in the flip-flop is changed by applying electrical signals to the cross-connected inverters via the access transistors. During a read operation, the access transistors are activated and the stored contents of the flip-flop are sensed.

To ensure high-speed operation, the access and pull-down transistors of such a conventional six-transistor SRAM cell have invariably been designed to be n-channel units. Consequently, the associated load or TFT transistors have invariably been p-channel units. Heretofore, all known SRAM cells of the basic type described above have thus included six transistors comprising two p-channel TFTs and four conventional n-channel devices.

To achieve a sufficiently high ON/OFF current ratio in the inherently leaky p-channel TFTs of such a basic cell, it has been found necessary in practice to resort to special measures. Thus, for example, the p-channel units are typically made as lightly-doped-drain (LDD) structures. For a description of a typical such LDD structure as applied to the TFTs of an SRAM cell, see "High Reliability and High Performance 0.35 μm Gate-Inverted TFTs for 16 Mbit SRAM Applications Using Self-Aligned LDD Structures" by C. Liu et al, IEDM 92, pages 823–826.

Another problem present in a conventional SRAM cell structure of the type described above stems from the presence therein of sodium ions. Even in a carefully controlled manufacturing process, some sodium ions inevitably end up in the structure and deleteriously affect the yield of the process, as is well known in the semiconductor art. The presence of such ions can cause excessive electrical leakage in the structure and thus degrade the performance of the cell. This degradation due to leakage stemming from the presence of sodium ions is particularly severe in the conventional n-channel transistors of the basic six-transistor cell.

Furthermore, in a conventional SRAM cell of the type specified above, the n-channel access and pull-down transistor structures typically suffer from what is commonly referred to as hot-carrier aging. This stems from the fact that in an n-type MOS transistor structure some high-kinetic-energy carriers (electrons) can penetrate into the gate oxide of the structure. (The liklihood of such penetration increases as the channel length of the transistor decreases.) In turn, such penetration can shift the threshold voltage of the transistor in an unacceptable way and cause harmful leakage in the device. In time, due to the hot-carrier-aging phenomenon, the performance of the SRAM cell may accordingly fall outside specified limits and thereby render the SRAM unsuitable for its intended function.

Thus, it was recognized that a need existed for an SRAM cell design that was simpler and less susceptible to the aforementioned sodium-ion and hot-carrier-aging phenomena. It was apparent that such a cell design, if available, could improve the yield and lower the cost of SRAMs while at the same time improving the lifetime and operating reliability of such memories.

SUMMARY OF THE INVENTION

In accordance with the principles of the present invention, an SRAM cell comprises two n-channel TFTs and four conventional transistors. Each n-channel TFT is connected in series with an associated p-channel transistor to form an inverter. Each inverter includes a node point between the two series-connected transistors. The gate electrodes of the transistors of each inverter are connected together and to the node point of the other inverter. In turn, the node points are respectively connected via associated p-channel access transistors to complementary bit lines. The gate electrodes of the access transistors are connected together and to an enabling line.

BRIEF DESCRIPTION OF THE DRAWING

A complete understanding of the present invention and of the above and other features and advantages thereof may be gained from a consideration of the following detailed description presented hereinbelow in connection with the accompanying single-figure drawing, which is a schematic representation of a specific illustrative SRAM cell made in accordance with the principles of the present invention.

DETAILED DESCRIPTION

The SRAM cell shown in the drawing is capable of storing a binary digit (a "1" or a "0"). Multiple such cells are interconnected and combined with associated peripheral circuitry to form an overall memory unit, as is well known in the art.

The illustrative cell shown in the drawing comprises two n-channel MOS transistors designated by reference numerals 10 and 12 and four p-channel MOS transistors 14 through 17. In accordance with the invention, the transistors 10 and 12 constitute conventional TFT devices and function as so-called pull-down elements in the depicted arrangement. In practice, the TFT devices are formed in polysilicon (or even in amorphous silicon) overlying a crystalline silicon substrate in which the transistors 14 through 17 are formed.

The transistors 14 and 15 of the SRAM cell represented in the drawing are conventional p-channel transistors and function as load devices. Together, the series-connected pull-down device 10 and its associated load transistor 14 comprise an inverter, as do the corresponding series-connected transistors 12 and 15. Each of these inverters is connected between power supply lines 18 and 20 which are respectively designated in the drawing as $V_{SS}$ and $V_{DD}$. In one specific illustrative case, $V_{DD}$ comprises a low positive direct-current voltage such as +3.3 or +5.0 volts, and $V_{SS}$ comprises a reference potential such as ground.

The schematic representation shown in the drawing includes a node point 22 between the series-connected devices 10 and 14 and a second node point 24 between the series-connected devices 12 and 15. The gate electrodes of the devices 12 and 15 are electrically connected together and to the node point 22. Similarly, the gate electrodes of the devices 10 and 14 are electrically connected together and to the node point 24. In that way, the noted inverters are cross-connected in a standard fashion to form a flip-flop.

The conventional p-channel devices 16 and 17 comprise so-called access transistors. The device 16 is connected between the node point 22 and a bit line 26, whereas the device 17 is connected between the node point 24 and a complementary bit line 28. Further, the gate electrodes of the devices 16 and 17 are connected together and to an enabling (or word) line 30.

Illustratively, the n-channel TFT devices 10 and 12 are fabricated so as to be substantially identical to each other. Additionally, the p-channel devices 14 through 17 are also made to be substantially identical to each other. By way of example, each of the standard TFT devices 10 and 12 is designed to have a width of about 0.5 micrometers (μm) and an electrical gate length of approximately 0.8 μm. In that illustrative case, each of the conventional devices 14 through 17 is designed, for example, to have a width of about 0.5-to-1.0 μm and an electrical gate length of approximately 0.5 μm. By utilizing known transistor structures of that size, extremely small cell dimensions can be achieved. In practice, an overall SRAM memory having a storage capacity of approximately four Megabits can be thereby realized in a semiconductor chip having dimensions of only about 0.6 centimeters (cm) by 2.4 cm.

To understand the mode of operation of the SRAM cell shown in the drawing, assume, for example, that quiescently the access transistors 16 and 17 are OFF or nonconducting and that voltages (due to stored charge) of 0 and +5 volts, respectively, exist at the node points 22 and 24. Illustratively, this condition is representative of the depicted cell storing "1" signal.

To read the aforementioned "1" state stored in the cell represented in the drawing, an enabling or 0-volt signal is applied to the word line 30. This activates (renders conductive) the access transistors 16 and 17 and thereby connects the node points 22 and 24 to the bit lines 26 and 28, respectively. In turn, a conventional amplifier (not shown) connected to the lines 26 and 28 senses the polarity of the voltage difference between the node points 22 and 24 and thus determines the binary value of the signal stored in the cell.

During a write operation, a 0-volt enabling signal is again applied to the word line 30. As before, this enables the access transistors 16 and 17. Then, for example, to change the above-assumed "1" signal stored in the cell to a "0" value, a +5-volt signal is applied to the bit line 26 and a 0-volt signal is applied to the complementary bit line 28. This causes the right-hand load TFT device 12 to conduct and the left-hand load TFT device 10 to be rendered nonconductive. In turn, this causes the left-hand node point 22 to charge to +5 volts and the right-hand node point 24 to charge to 0 volts, which stored-charge conditions are indicative of a "0" signal stored in the cell.

As the trend to high-density sub-micron SRAM designs continued, it was found that the speed of operation of such a memory was no longer dominated or determined mainly by the speed of the pull-down and access transistors. Instead, the speed of operation of the memory was found to be limited to a large extent by the speed of the peripheral circuitry associated with the memory cells as well as by the RC time delays introduced by the metal lines included in the memory layout. Furthermore, in short-channel transistors, the speed advantage of n-channel devices over p-channel ones becomes less. For these reasons, it was determined for the first time to consider the feasibility of changing the standard cell design to utilize p-channel rather than n-channel transistors as the load and access units of the herein-described six-transistor SRAM cell.

Once a decision was made to replace the n-channel transistors of a conventional six-transistor SRAM cell with p-channel devices, it was discovered that significant practical advantages accrued to the new design. At the same time, the speed of operation of a memory system that included the new cells was determined to be approximately comparable to that of systems made of conventional cells.

First of all, it was discovered that n-channel TFT devices employed as the pull-down units in a six-transistor SRAM cell exhibit a sufficiently low OFF current and a sufficiently high ON/OFF current ratio without the necessity of fabricating the n-channel transistors as LDD-type devices. In practice, such simpler and less-costly non-LDD devices (with relatively constant-depth source and drain regions) were found to exhibit an advantageous ON/OFF current ratio of about $10^7$. Moreover, $I_{ON}$ in such an n-channel TFT was determined to be at least ten times higher than the highest $I_{ON}$ reported for p-channel TFTs. As a result, higher integration densities and improved stability of operation of the aforespecified cell relative to a conventional six-transistor cell were thereby made feasible. In particular, the immunity of the circuit to the occurrence of soft errors caused by noise or radiation was enhanced.

Another significant advantage of a six-transistor SRAM cell of the type shown in the drawing is its relative immunity to the presence of positive sodium ions in the semiconductor chip structure. Such ions primarily affect the electrical characteristics (leakage and threshold voltage) of the conventional MOS devices formed in the substrate. The influence of these ions on the overlying TFTs is relatively minor. Thus, since all the cell transistors formed in the chip substrate in accordance with the invention are p-channel units, any positive sodium ions present in the structure do not substantially affect the electrical operation of those transistors and in some cases, actually enhance the isolation properties between these p-channel units. This characteristic of p-channel devices in the presence of sodium ions is well known in the art. Accordingly, the electrical properties of a six-transistor cell made in accordance with the principles of the present invention are less affected by the presence of sodium ions than is the conventional counterpart cell.

Additionally, the problem known as hot-carrier aging arising from high-kinetic-energy electrons in the transistors of a conventional SRAM cell is practically non-existent in the inventive design shown in the drawing. This phenomenon, which affects n-channel MOS devices (and typically becomes more severe as channel lengths get shorter) is not present in the p-channel load and access transistors 14 through 17. And, since the n-channel TFT pull-down devices 10 and 12 are made in polysilicon (or even in amorphous silicon), wherein the mobility of electrons is orders of magnitude less than in crystalline silicon, the probability of high-kinetic-energy damage to the TFT units is extremely low. As a result, the long-term stability and reliability of high-density memories that include the specific illustrative SRAM cell shown in the drawing are significantly enhanced relative to memories made with conventional six-transistor cells.

In summary, a six-transistor SRAM cell made in accordance with the principles of the present invention is characterized by simplicity (the pull-down TFTs need not be LDD devices), good electrical characteristics (low leakage due to enhanced isolation properties) and good long-term stability and reliability (due to minimal hot-carrier aging). A memory system made of such cells thus possesses advantageous cost and operating properties relative to a system made of conventional cells.

Finally, it is to be understood that the above-described arrangements are only illustrative of the principles of the present invention. In accordance with these principles, numerous modifications and alternatives may be devised by those skilled in the art without departing from the spirit and scope of the invention.

What is claimed is:

1. An SRAM cell comprising
    a first series arrangement comprising a first n-channel pull-down transistor including source, drain and gate electrodes and having its source-to-drain path connected in series with the source-to-drain path of a first p-channel load transistor that includes source, drain and gate electrodes,
    a second series arrangement comprising a second n-channel pull-down transistor including source, drain and gate electrodes and having its source-to-drain path connected in series with the source-to-drain path of a second p-channel load transistor that includes source, drain and gate electrodes,
    a first node point in the series connection between said first n-channel transistor and said first p-channel transistor,
    a second node point in the series connection between said second n-channel transistor and said second p-channel transistor,
    means connecting the gate electrodes of said first n-channel transistor and said first p-channel transistor together and to said second node point,
    means connecting the gate electrodes of said second n-channel transistor and said second p-channel transistor together and to said first node point,
    first and second p-channel access transistors each having source, drain and gate electrodes,
    a bit line,
    a complementary bit line,
    a word line,
    two direct-current power supply lines,
    means including the source-to-drain path of said first access transistor connecting said first node point to said bit line,
    means including the source-to-drain path of said second access transistor connecting said second node point to said complementary bit line,
    means connecting the gate electrodes of said access transistors together and to said word line,
    and means connecting each of said first and second series arrangements between said power supply lines,
    wherein only said first and second n-channel pull-down transistors each comprise a thin-film transistor, and wherein each of said p-channel transistors comprises a metal-oxide-semiconductor transistor formed in a crystalline silicon substrate that underlies said thin-film transistors.

2. A cell as in claim 1 wherein each of said first and second n-channel thin-film transistors is of the non-LDD type.

3. A cell as in claim 1, wherein said first and second n-channel pull-down transistors are substantially identical to each other.

4. A cell as in claim 3 wherein said p-channel load and access transistors are substantially identical to each other.

5. A cell as in claim 4 wherein the power supply line connected to one of the source and drain electrodes of the first and second n-channel pull-down transistors is designated $V_{SS}$ and is adapted to be connected to a point of reference potential.

6. A cell as in claim 5 wherein the power supply line connected to one of the source and drain electrodes of the first and second p-channel load transistors is designated $V_{DD}$ and is adapted to be connected to a positive direct-current voltage.

7. A cell as in claim 6 wherein each of said first and second n-channel pull-down transistors has a width of about 0.5 μm and an electrical gate length of approximately 0.8 μm.

8. A cell as in claim 7 wherein each of said p-channel load and access transistors has a width of about 0.5 to 1.0 μm and an electrical gate length of approximately 0.5 μm.

9. A cell as in claim 8 wherein said $V_{SS}$ power supply line is adapted to be connected to ground and the $V_{DD}$ power supply line is adapted to be connected to +3.3 volts.

10. A cell as in claim 8 wherein the $V_{SS}$ power supply line is adapted to be connected to ground and the $V_{DD}$ power supply line is adapted to be connected to +5 volts.

* * * * *